United States Patent
Mackh et al.

(10) Patent No.: US 8,697,574 B2
(45) Date of Patent: Apr. 15, 2014

(54) THROUGH SUBSTRATE FEATURES IN SEMICONDUCTOR SUBSTRATES

(75) Inventors: Gunther Mackh, Neumarkt (DE); Uwe Seidel, München (DE); Rainer Leuschner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 12/567,551

(22) Filed: Sep. 25, 2009

(65) Prior Publication Data

US 2011/0073987 A1 Mar. 31, 2011

(51) Int. Cl.
*H01L 21/44* (2006.01)

(52) U.S. Cl.
USPC ..... 438/667; 438/668; 257/277; 257/E23.174

(58) Field of Classification Search
USPC .............. 438/3, 667, 668, 381; 257/531, 277, 257/774, E21.022, E23.011, E23.067, 257/E23.145, E23.175, E21.585
See application file for complete search history.

(56) References Cited

U.S. PATENT DOCUMENTS

| | | | |
|---|---|---|---|
| 3,881,224 A | 5/1975 | Wirth | |
| 5,583,474 A * | 12/1996 | Mizoguchi et al. | 336/83 |
| 6,054,329 A | 4/2000 | Burghartz et al. | |
| 6,240,622 B1 * | 6/2001 | Ahn et al. | 29/604 |
| 6,287,932 B2 | 9/2001 | Forbes et al. | |
| 6,830,970 B2 * | 12/2004 | Gardes | 438/238 |
| 6,989,578 B2 * | 1/2006 | Yeh et al. | 257/531 |
| 7,176,128 B2 | 2/2007 | Ahrens et al. | |
| 8,072,042 B1 * | 12/2011 | Kroener | 257/531 |
| 8,072,307 B2 * | 12/2011 | Kijima | 336/200 |
| 2003/0068884 A1 | 4/2003 | Gardes | |
| 2005/0153546 A1 | 7/2005 | Ahrens et al. | |
| 2005/0194670 A1 | 9/2005 | Kameyama et al. | |
| 2006/0022787 A1 * | 2/2006 | Brennan et al. | 336/200 |
| 2008/0020488 A1 * | 1/2008 | Clevenger et al. | 438/3 |
| 2008/0081157 A1 | 4/2008 | Schneegans et al. | |
| 2008/0136574 A1 * | 6/2008 | Jow et al. | 336/200 |
| 2008/0213966 A1 | 9/2008 | Lee et al. | |
| 2009/0140383 A1 * | 6/2009 | Chang et al. | 257/531 |
| 2009/0302480 A1 * | 12/2009 | Birner et al. | 257/774 |

FOREIGN PATENT DOCUMENTS

| | | |
|---|---|---|
| EP | 1 553 625 A1 | 7/2005 |
| EP | 1 564 807 A2 | 8/2005 |
| FR | 2 830 670 A1 | 4/2003 |

* cited by examiner

*Primary Examiner* — Cuong Q Nguyen
*Assistant Examiner* — Yosef Gebreyesus
(74) *Attorney, Agent, or Firm* — Slater & Matsil, L.L.P.

(57) ABSTRACT

Through substrate features in semiconductor substrates are described. In one embodiment, the semiconductor device includes a through substrate via disposed in a first region of a semiconductor substrate. A through substrate conductor coil is disposed in a second region of the semiconductor substrate.

25 Claims, 17 Drawing Sheets

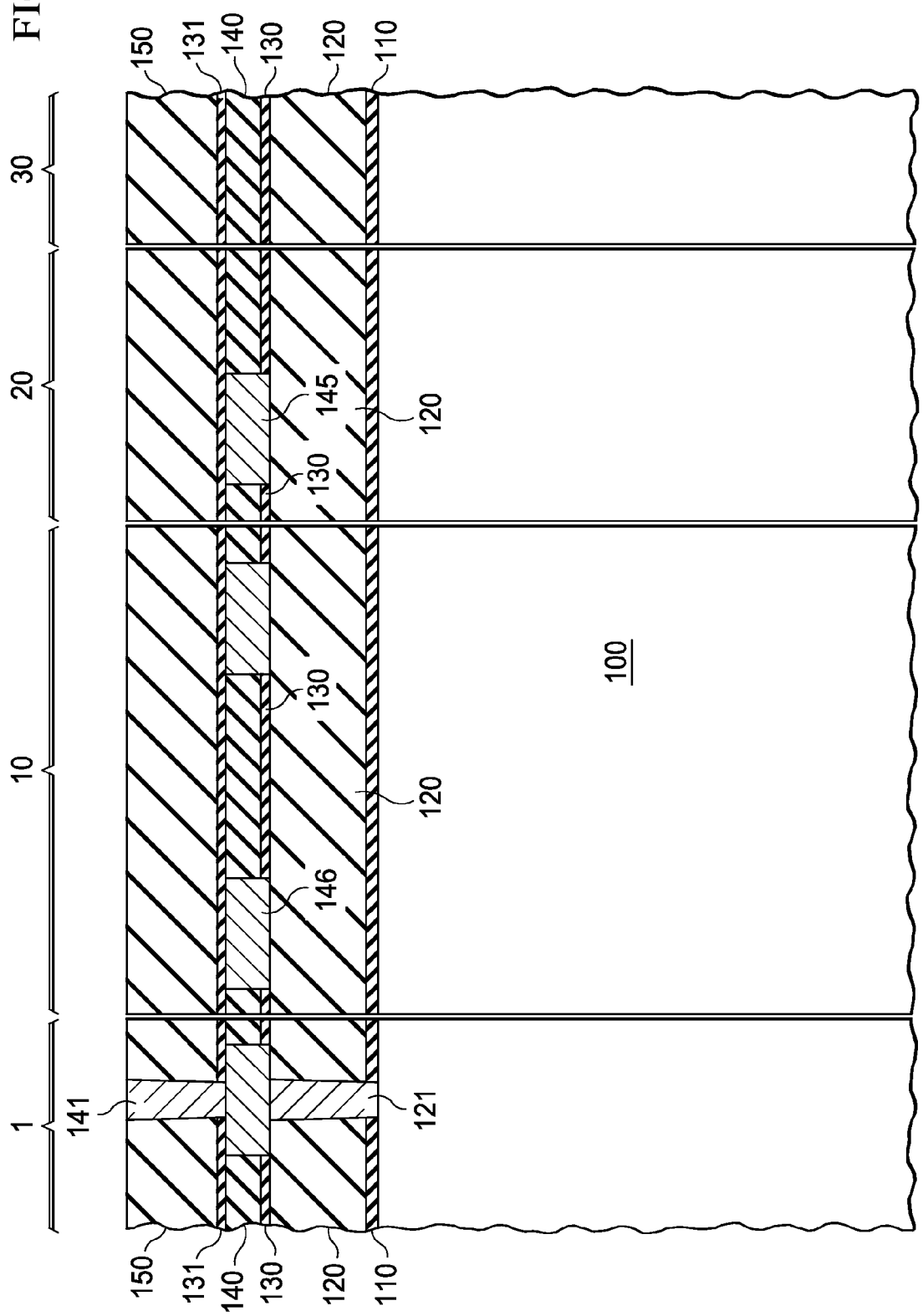

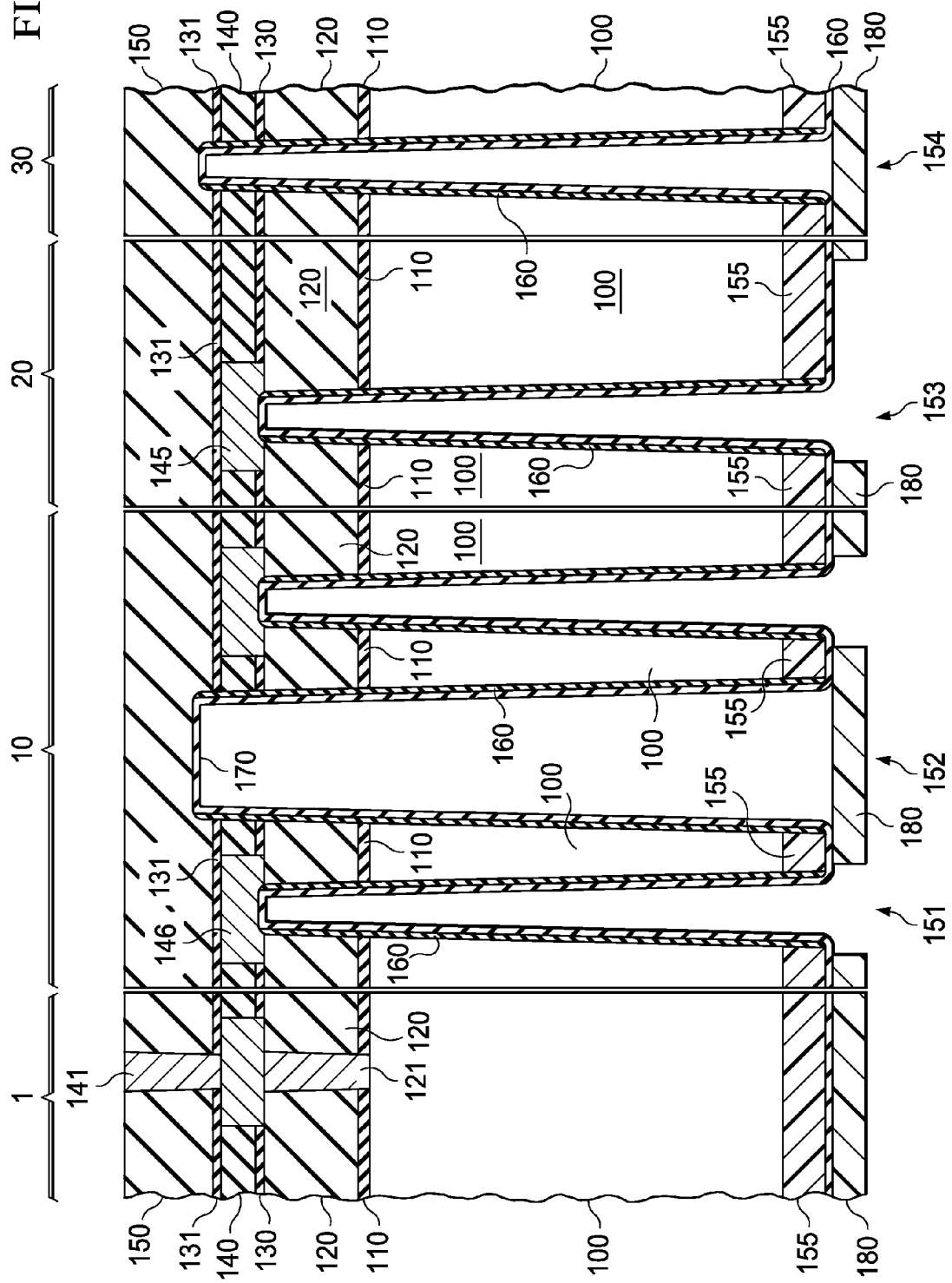

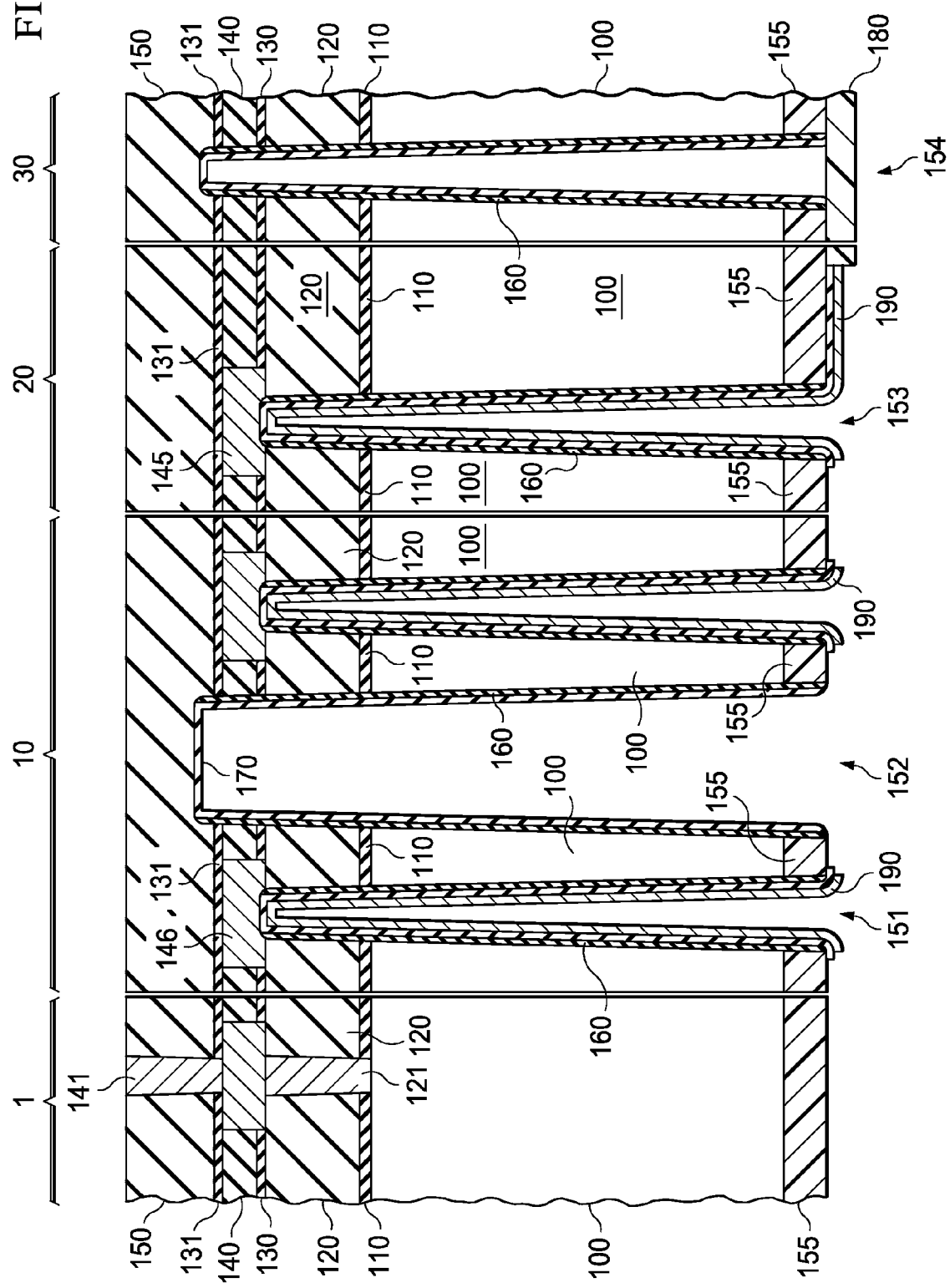

US 8,697,574 B2

THROUGH SUBSTRATE FEATURES IN SEMICONDUCTOR SUBSTRATES

TECHNICAL FIELD

The present invention relates generally to through substrate features, and more particularly to through substrate features in semiconductor substrates.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing various types of active and passive devices on the same die. However such integration creates additional challenges that need to be overcome. For example, conventional structures require large surface areas or have poor electrical quality. For aggressive integration, it is essential to have a low surface area along with a high quality factor. Further, conventional processes require separate formation of the inductor increasing the process cost.

In one aspect, the present invention provides a structure and method of forming inductors having high inductivity and low resistivity without a significant increase in production costs.

SUMMARY OF THE INVENTION

Embodiments of the invention include through substrate coils and/or through substrate openings forming a kerf region. In accordance with an embodiment of the present invention, a semiconductor device comprises a through substrate via disposed in a first region of a semiconductor substrate, and a through substrate conductor coil disposed in a second region of the semiconductor substrate.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 3, which includes

FIG. 4, which includes FIGS. 4a-4k, illustrates a semiconductor device comprising a through substrate coil during various stages of fabrication, in accordance with an embodiment of the invention, wherein FIGS. 4a-4b and 4d-4k illustrate cross sectional views and FIG. 4c illustrates a top view; and FIG. 5, which includes FIGS. 5a-5c, illustrates a transformer coil in accordance with an embodiment of the invention, wherein FIG. 5a illustrates a perspective view, and whereas FIGS. 5b and 5c illustrate top views of the transformer device.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely through substrate vias, inductors, and dicing openings formed using shared process steps. The invention may also be applied, however, to other through substrate features not discussed herein.

A structural embodiment of the invention will be described first using FIG. 1. Further structural embodiments will be described with respect to FIGS. 2, 3 and 5. A method of fabrication of the semiconductor device will be described using FIG. 4.

Figure 1:
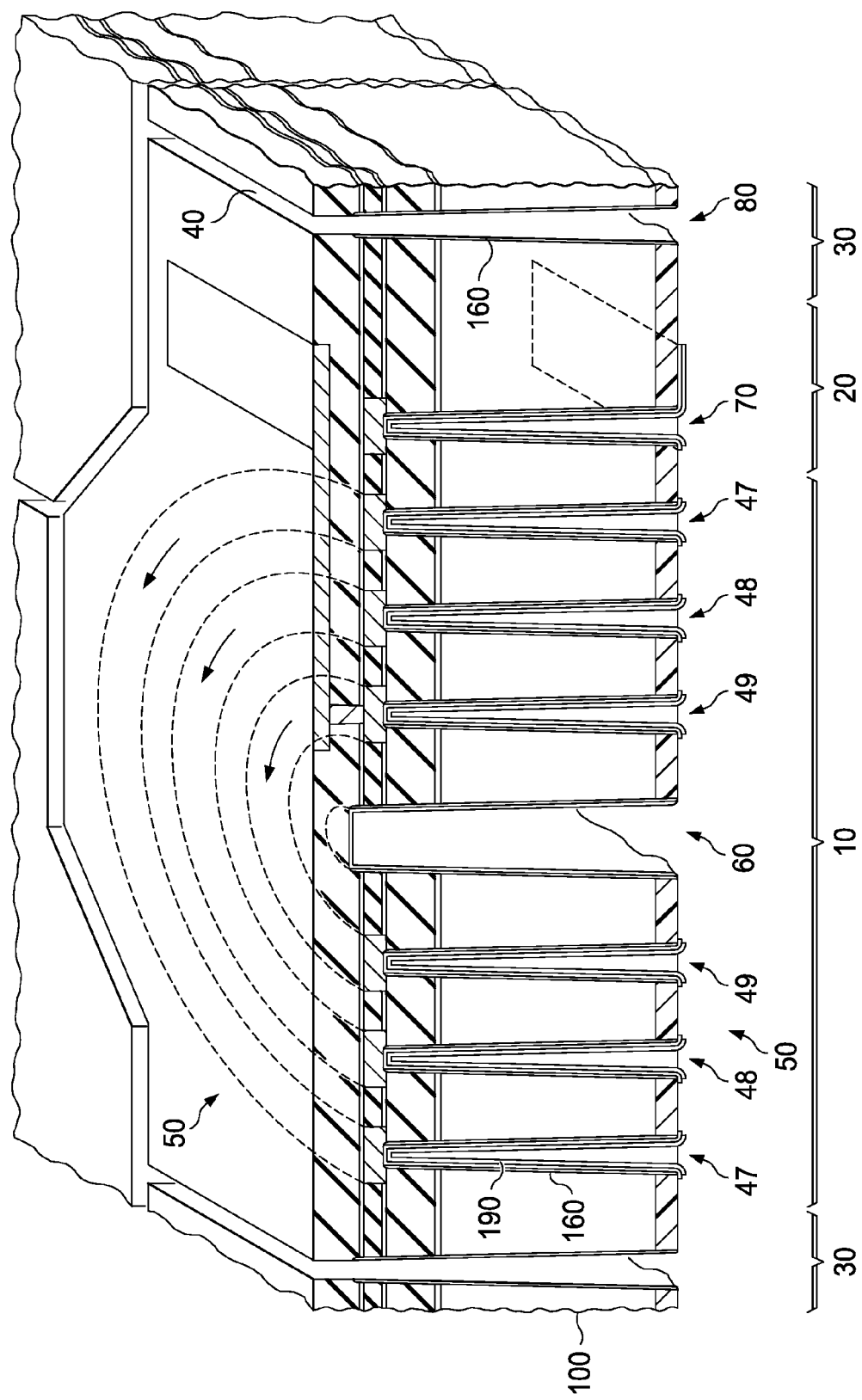
FIG. 1 illustrates a perspective view of a through substrate (TS) coil with a cavity along with a through substrate via (TSV) contact and a TS kerf in accordance with an embodiment of the invention.

FIG. 1 illustrates a structural embodiment of a semiconductor device comprising a through substrate coil 50 with a cavity 60 disposed in a spiral coil region 10, a through substrate via 70 disposed in a contact region 20, and a through substrate opening 80 forming a kerf 40 disposed in a kerf region 30 of a substrate 100.

The through substrate coil 50 is disposed within the substrate 100; the through substrate coil 50 is formed in a through substrate opening that is completely or partially filled with a conductive fill material 190 and lined with an insulating dielectric liner (e.g., sidewall dielectric layer 160). The sidewall dielectric layer 160 insulates the conductive fill material 190 from the substrate 100. In various embodiments, the through substrate coil 50 may comprise more than one through substrate rings 47-49. The deep through substrate coil 50 has a lower resistance than metal lines disposed within metallization levels. The use of through substrate coil 50 as the inductor consequently improves the quality (Q) factor of the inductor, which is inversely proportional to the total resistance of the inductor coil.

In various embodiments, the through substrate rings 47-49 are coupled to each other through the front side metallization. Alternatively, in some embodiments, the through substrate rings 47-49 are coupled to each other through a back side metallization, e.g., through a back side redistribution layer.

In one embodiment, a cavity 60 is disposed in the central core of the through substrate coil 50, the cavity being disposed as a through substrate opening. The diameter of the cavity 60 is larger than the diameter for the through substrate via 70 in one embodiment. In various embodiments, the cavity 60 is wider than the through substrate via 70 by at least a factor of two.

In various embodiments, the through substrate coil 50 may be formed as a discrete device or in a single integrated chip comprising other circuitry.

FIG. 1 also illustrates a through substrate via 70 coupling the front side metallization with the back side circuitry.

A through substrate opening 80 forming a kerf 40 is disposed in a kerf region 30. In a typical process, dozens or hundreds of chips are typically manufactured on a single semiconductor wafer. The individual dies are singulated by sawing the integrated circuits along a scribe line within an area called the kerf (or dicing channel or dicing street). Cracks formed either during or after the sawing operation may propagate into the die resulting in the failure of the die/chip. Consequently, special protective structures are added into the die to prevent crack propagation. This consumes a large surface area of the substrate (both on the kerf and additional region around the die boundary) to accommodate these protective structures as well as to allow for errors during the mechanical sawing process.

Unlike conventional systems, the width of the kerf 40 in various embodiments is much smaller because the aspect ratio of the through substrate opening 80 is high due to the fact that it is formed along with the through substrate via 70 instead of a mechanical sawing/dicing process which requires a larger surface width. Further, the reduced mechanical sawing advantageously reduces/prevents crack formation during the dicing process.

Advantageously, embodiments of the invention enable higher silicon efficiency due to smaller kerf widths than other conventional kerfs and also due to the use of non-rectangular chip layouts (e.g., for coils). Further savings in silicon real estate is obtained due to optimized routing of the wafer front-side circuitry by using back-side circuitry enabled by TSVs. In various embodiments, metallization layers disposed directly above the coils may include other devices (e.g., MIMs, resistors, fuses, and pads) enabling further savings in silicon real estate.

Figure 2A:
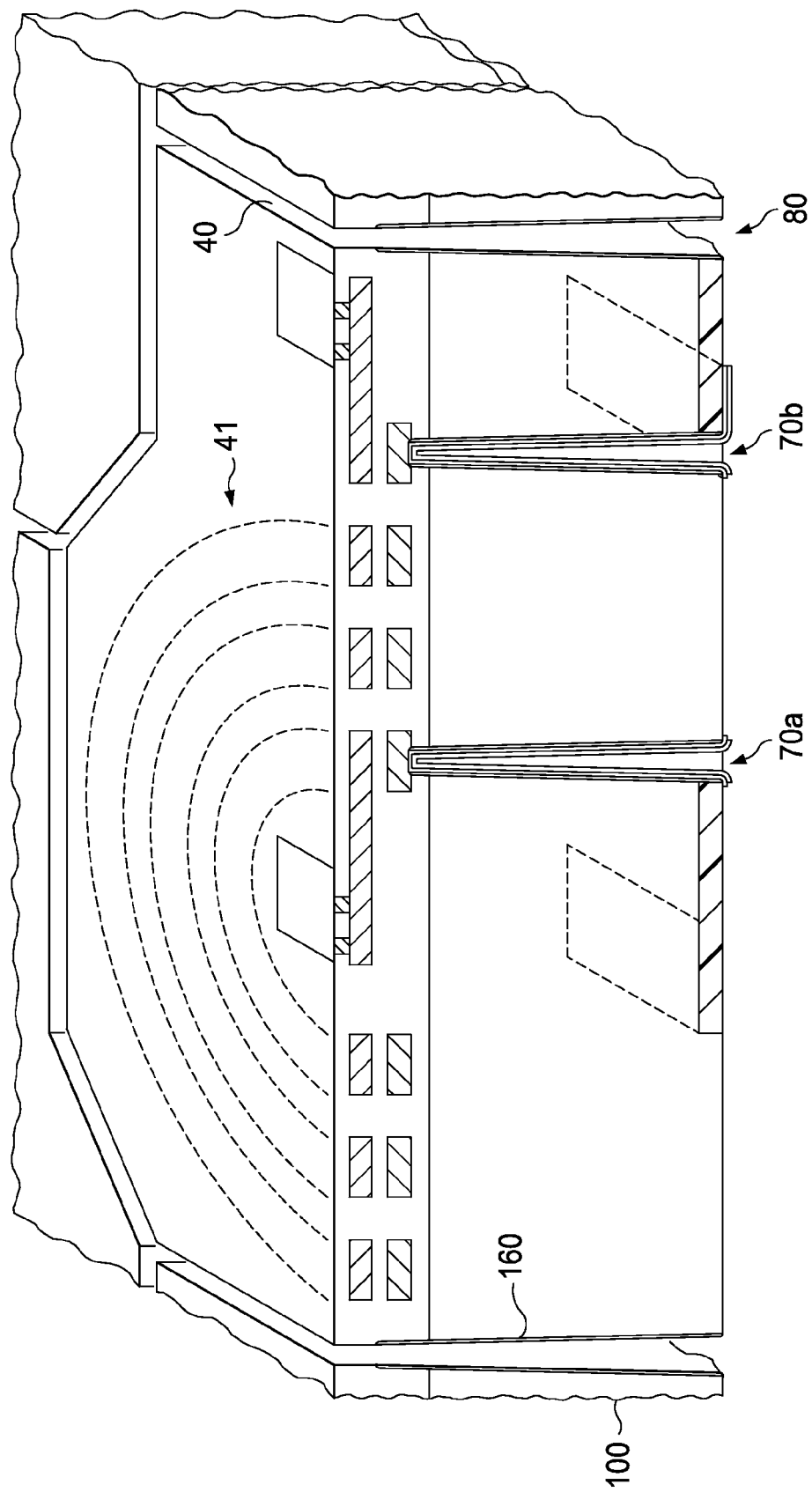
FIGS. 2a and 2b, illustrates a perspective view of through substrate coils in accordance with an embodiment of the invention.
Figure 2B:
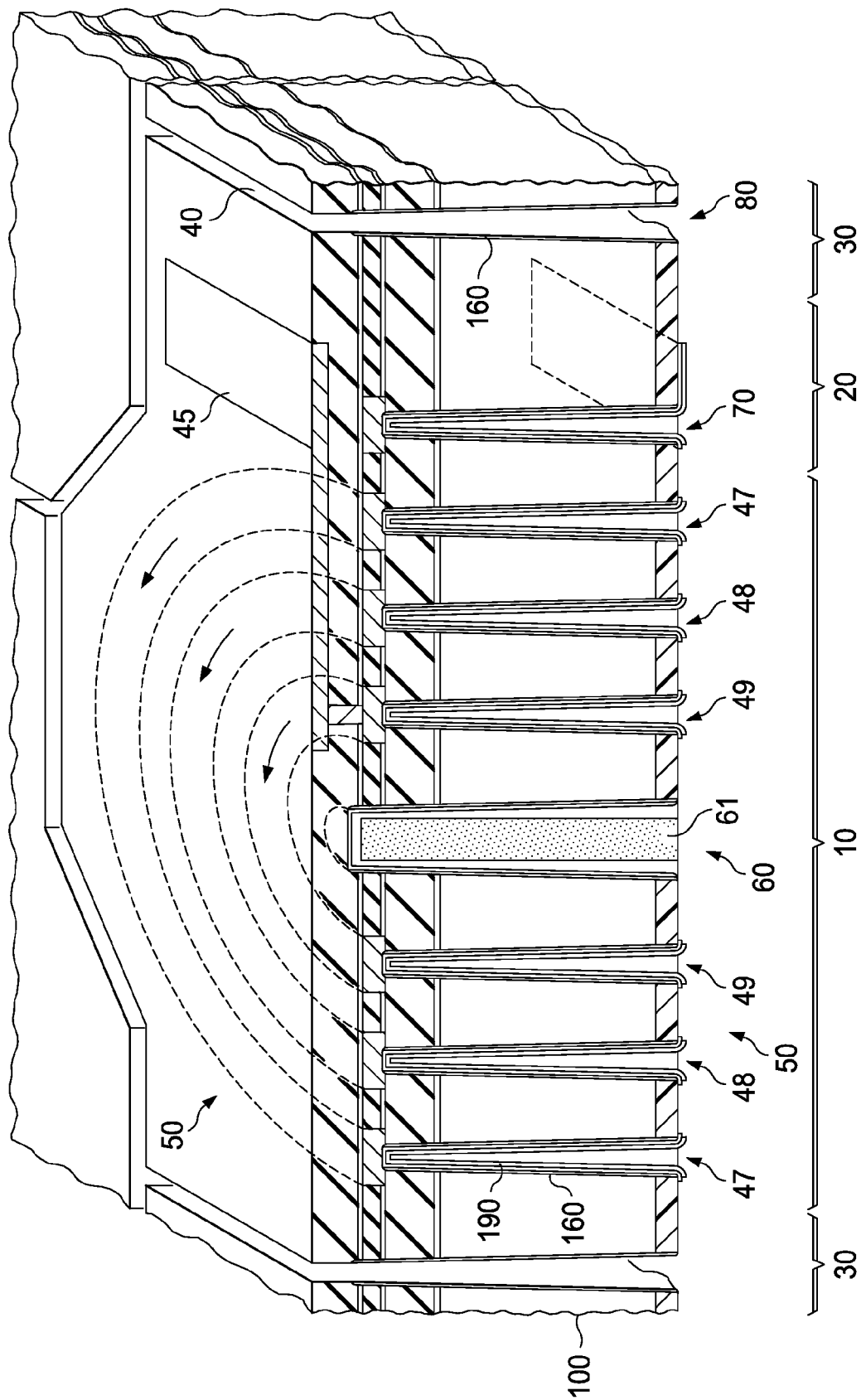

FIG. 2 illustrates perspective views of further structural embodiments, wherein FIG. 2a illustrates an embodiment having a kerf formed with a through substrate opening, and wherein FIG. 2b illustrates a spiral inductor with a magnetic central core in another embodiment.

FIG. 2a illustrates a conventional spiral coil inductor 41 formed within the metallization layers above a substrate 100. The convention spiral coil inductor 41 is typically formed using a damascene process and is disposed within a single metal level.

FIG. 2a illustrates a semiconductor substrate comprising a first and a second through substrate via 70a and 70b and a through substrate opening 80 forming a kerf 40. In this embodiment, a through substrate opening 80 is used to form the kerf 40 and hence utilizes all the advantages discussed above with respect to forming kerf regions that utilize less surface area on the substrate 100.

FIG. 2b illustrates an embodiment wherein the central core of the through substrate coil 50 is filled with a magnetic material 61 of high permeability. The magnetic material 61 may comprise a ferromagnetic or ferrimagnetic material including MnZn ferrite, NiZn ferrite, NiFe ferrite, NiCuZn alloy, mu-metals, iron, nickel, and combinations thereof. The high permeability of the magnetic core causes the magnetic field lines to be concentrated in the core material. The use of the magnetic core increases the inductance of the spiral inductor by many multiples in various embodiments. The increased inductance helps to improve the quality factor which depends directly on the inductance.

In various embodiments, the through substrate coil 50 can be contacted either from the wafer front side (e.g., through contact pads 45) or from the wafer back side (through back side pads coupled to a through substrate via). The illustrated embodiment shows a front side contact to the through substrate coil 50 using contact pads 45.

Figure 3A:
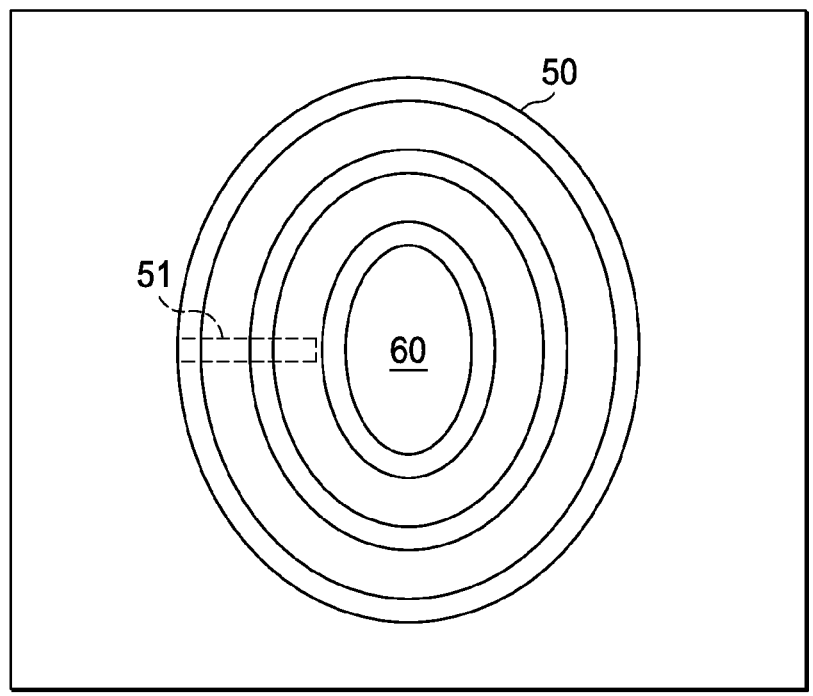
FIGS. 3a and 3b, illustrates a top view of a through substrate coil, in accordance with an embodiment of the invention.
Figure 3B:
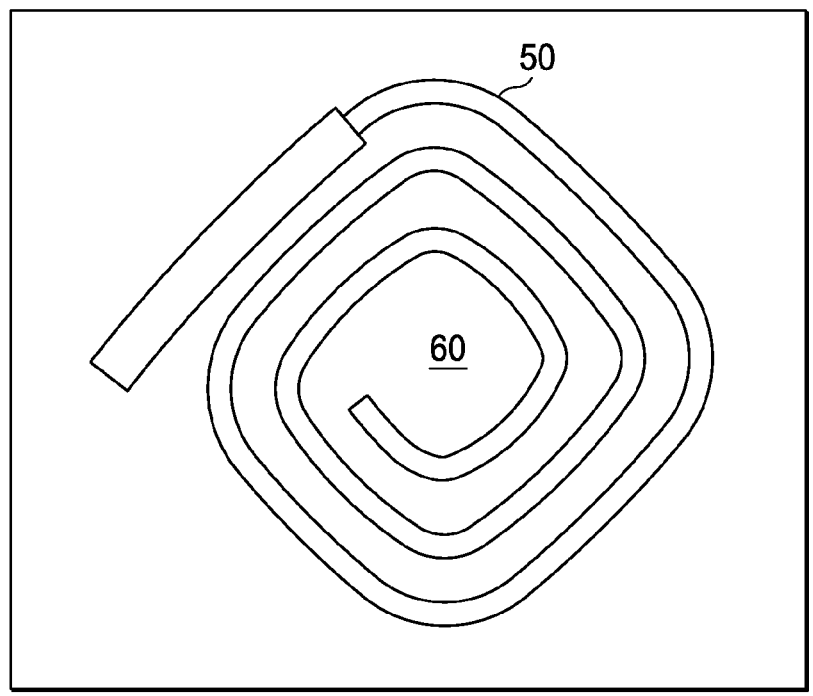

FIG. 3, which includes FIGS. 3a and 3b, illustrates a top view of the through substrate coil 50. In one embodiment, through substrate coil 50 are formed as concentric rings (FIG. 3a), for example coupled through interconnects features 51, whereas in another embodiment, the spiral conductor coils are formed as a spiral coil (FIG. 3b). Further, in various embodiments, any suitable configuration of the spiral coils may be used.

Figure 4B:
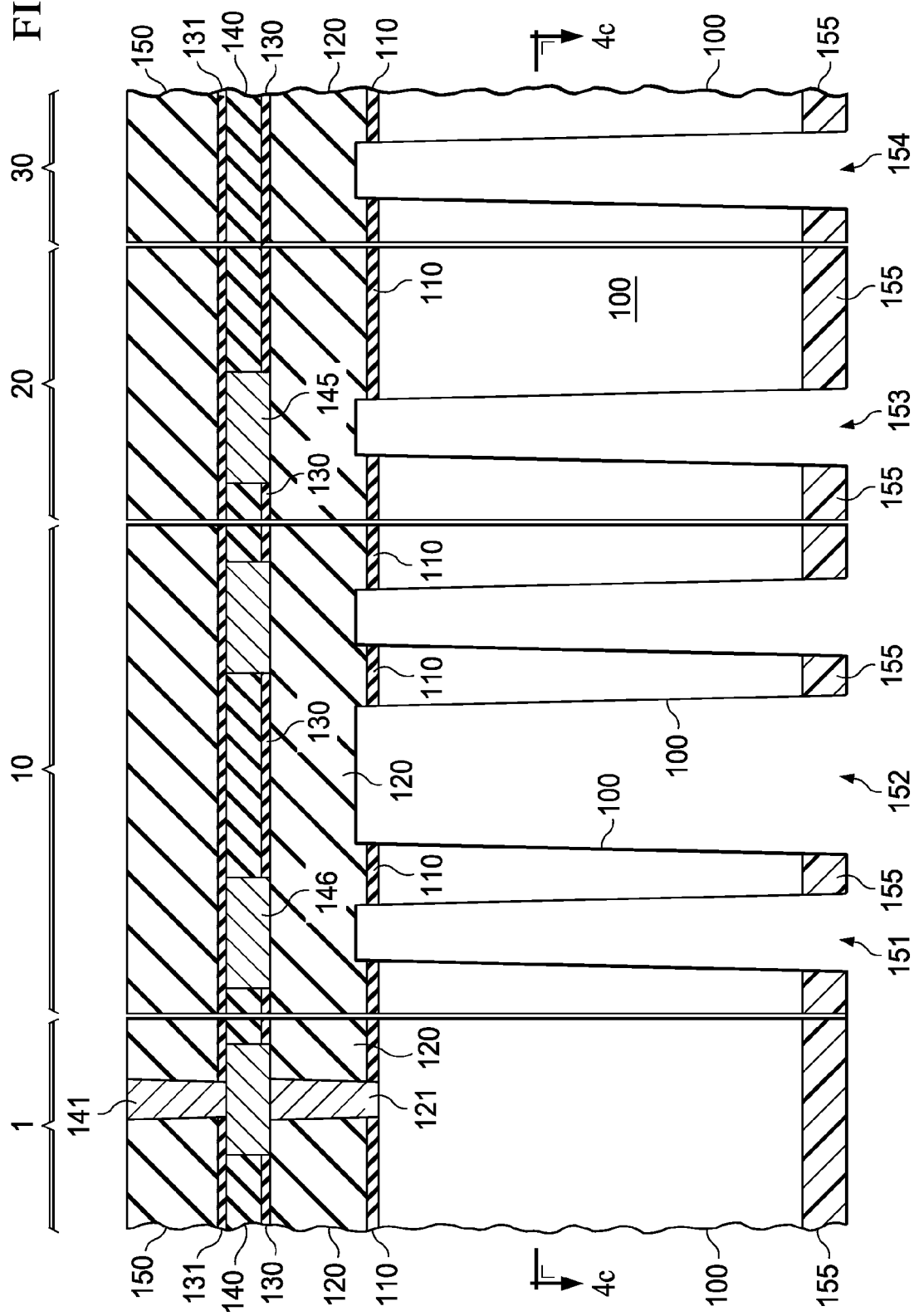
Figure 4C:
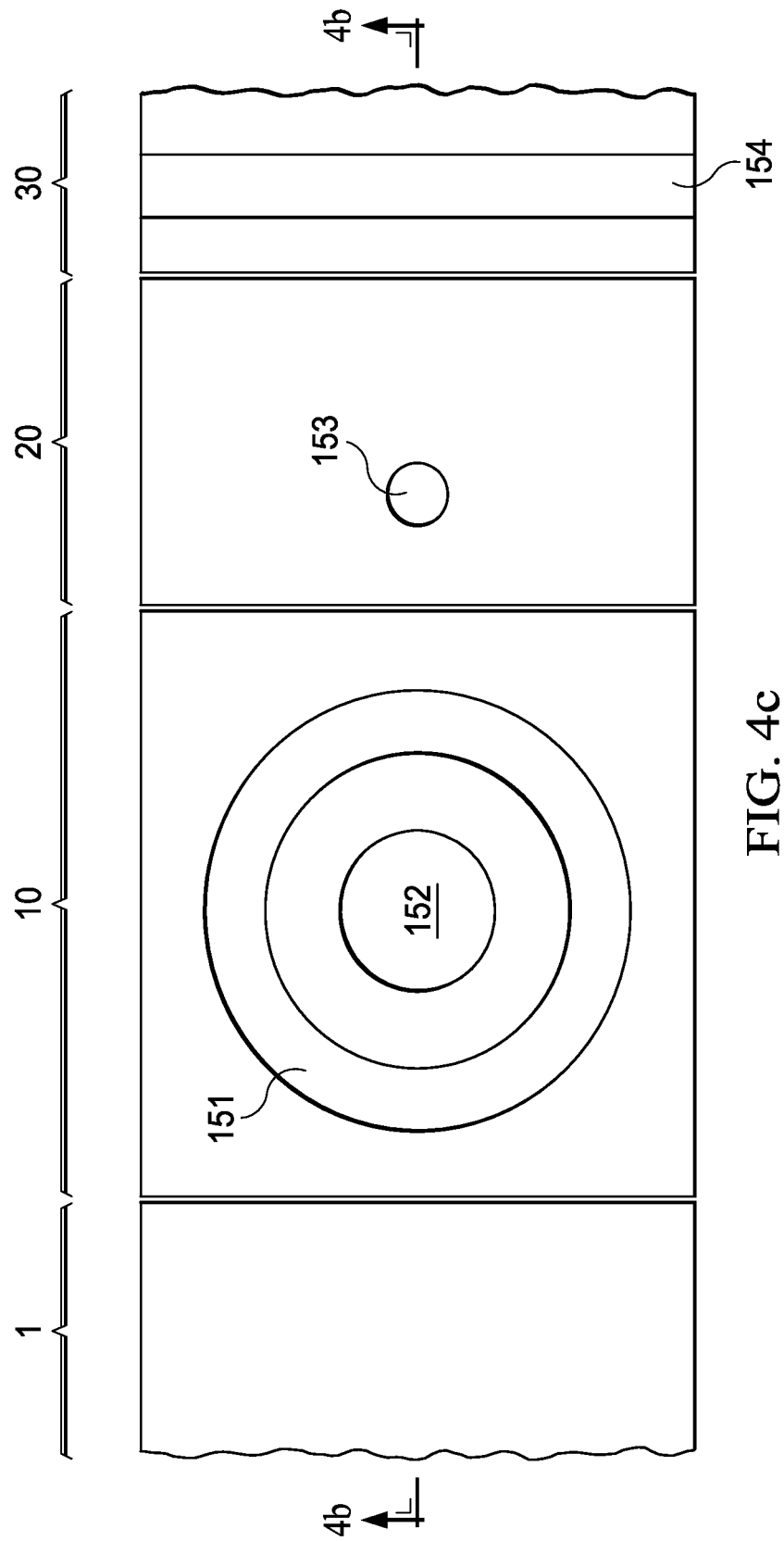

FIG. 4, which includes FIG. 4a-4k, illustrates a semiconductor device comprising a through substrate coil during various stages of processing, in accordance with an embodiment of the invention, wherein FIGS. 4a-4b, and 4d-4k illustrate cross sectional views and FIG. 4c illustrates a top view.

With reference now to FIG. 4a, the semiconductor device is illustrated after back end processing. An active region 1, spiral coil region 10, a contact region 20, and a kerf region 30 are illustrated in a substrate. Each region represents corresponding device structure to be built during processing. In various embodiments, at this stage in the process, the front end processes are completed and active devices fabricated in the active region 1. The device regions are formed near a top surface of a substrate 100.

The device regions, or active circuitry, can include transistors, resistors, capacitors, inductors or other components used to form integrated circuits. For example, active areas that include transistors (e.g., CMOS transistors) are formed separate from one another by isolation regions, e.g., shallow trench isolation.

Next, metallization is formed over the device regions to electrically contact and interconnect the device regions. The metallization and active circuitry together form a completed functional integrated circuit. In other words, the electrical functions of the chip can be performed by the interconnected active circuitry. In logic devices, the metallization may include many layers, e.g., nine or more, of copper. In memory devices, such as DRAMs, the number of metal levels may be less and may be aluminum.

The components formed during the front-end processing are interconnected by back end of line (BEOL) processing. During this process, contacts are made to the semiconductor body and are interconnected using metal lines and vias. As discussed above, modern integrated circuits incorporate many layers of vertically stacked metal lines and vias (multilevel metallization) that interconnect the various components in the chip. In FIG. 4a, only the first level of metal is illustrated above the substrate 100. At this stage of processing, the back end processes are also completed, and hence all the metallization levels connecting the active devices are fabricated.

Referring to FIG. 4a, first, second, and third metallization insulation layers 120, 140, and 150 are formed above a substrate 100. Each of the first, second, and third metallization insulation layers 120, 140, and 150 may comprise multiple layers. The first, second, and third metallization insulation layers 120, 140, and 150 are separated by first, second, and third etch stop liners 110, 130 and 131.

The first metallization insulation layer 110 preferably comprises an oxide such as tetra ethyl oxysilane (TEOS) or fluorinated TEOS (FTEOS), but various embodiments may comprise insulating materials typically used in semiconductor manufacturing for inter-level dielectric (ILD) layers. The first metallization insulation layer 120 may comprise a thickness of about 500 nm or less, for example, although alternatively, the first metallization insulation layer 120 may comprise other dimensions.

The second and third metallization insulation layers 140 and 150 comprise insulating materials typically used in semiconductor manufacturing for inter-level dielectric (ILD) layers, such as SiO2, tetra ethyl oxysilane (TEOS), or a lower dielectric constant material such as fluorinated TEOS (FTEOS), doped glass (BPSG, PSG, BSG), organo silicate glass (OSG), fluorinated silicate glass (FSG), or spin-on glass (SOG). The second and third metallization insulation layers 140 and 150 may comprise ultra-low k materials including porous dielectric materials.

Multiple metal lines comprising first metal lines 145 are disposed above the substrate 100. The metal lines are connected via the contact plugs 121, first vias 141, and further vias (not shown $V_3$, $V_4$, $V_5$, etc.). First vias 141 are disposed above the first metal lines 145. The first vias 141 comprise a copper core with an outer liner preferably of tantalum nitride and tantalum, although in some embodiments, the first vias 141 comprise tungsten and outer liners of titanium and titanium nitride or other metal liners or liner combinations.

In the spiral coil region, landing pads 146 are formed within the second metallization insulating layer 140. A passivation layer (not shown) is deposited over the last metal level. A hard mask layer (not shown) may be deposited over the passivation layer to protect the passivation layer during subsequent through substrate via etch.

Subsequently, the substrate 100 is thinned from the back surface and passivated. The substrate 100 is thinned exposing a lower surface by grinding to a desired thickness. The typical thickness of the substrate 100 after the thinning is about 30 μm to about 200 μm. In different embodiments, the thinning may also be performed chemically or by using a plasma etch. For example, a modified plasma etch may be used to thin the silicon wafer from the back side. Such techniques have the additional advantage of not damaging the front side.

FIG. 4b illustrates a cross sectional and 4c illustrates a corresponding top view of the semiconductor device during a subsequent stage of processing in accordance with an embodiment of the invention. Referring to FIGS. 4b and 4c, first, second, third, and fourth through substrate openings 151-154 are etched in the spiral coil region 10, the contact region 20, and the kerf region 30 after depositing a hard mask layer 155.

In some embodiments, through substrate openings of different diameters are etched. In one embodiment illustrated in FIG. 4b, multiple first through substrate openings 151 are etched in the spiral coil region 10. A second through substrate opening 152 is etched in the spiral coil region 10. The second through substrate opening 152 is etched in the central region of the spiral coil region 10, thus forming a core of the through substrate coil. Further, third through substrate opening 153 is etched in the contact region 20, and fourth through substrate opening 154 is etched in the kerf region 30. In various embodiments, the through substrate openings in the contact region 20 and the kerf region 30 may comprise a different diameter than the through substrate openings in the spiral coil region 10.

In various embodiments, the first, the second, the third, and the fourth through substrate openings 151-154 are formed using a resist only process, a Bosch Process, or by depositing a hard mask layer and etching the substrate 100 using a vertical reactive ion etch. In one embodiment, only a resist mask is used. If the resist budget is not sufficient, the use of a hard mask and vertical reactive ion etch may be preferred if a smooth sidewall is required. However, this integration scheme requires the removal of remaining hard mask residues. Hence, in some embodiments, a Bosch process that uses resist only and a deposition-etch process sequence which overcomes these limitations can be applied. The Bosch process produces sidewalls that are scalloped.

Figure 4D:
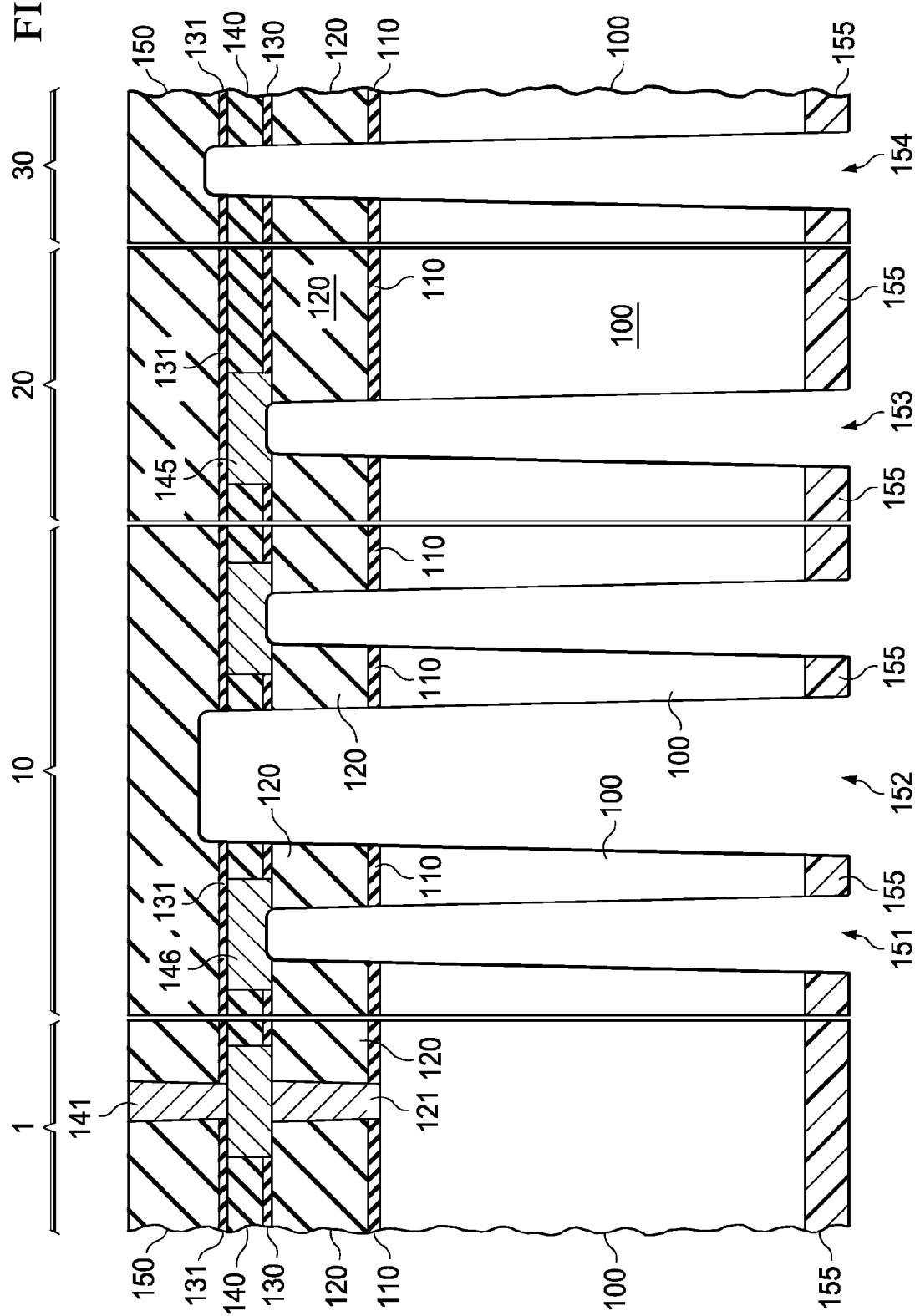

Referring next to FIG. 4d, a second etch is used to extend the through substrate openings into the first metallization insulating layer 120 through the first etch stop liner 110. The second etch may comprise a suitable anisotropic etch. The second etch stops at the landing pads 146, and hence stops the first and the third through substrate openings 151 and 153. However, a timed etch is needed to stop the second etch progressing through the second through substrate opening 152.

Figure 4E:
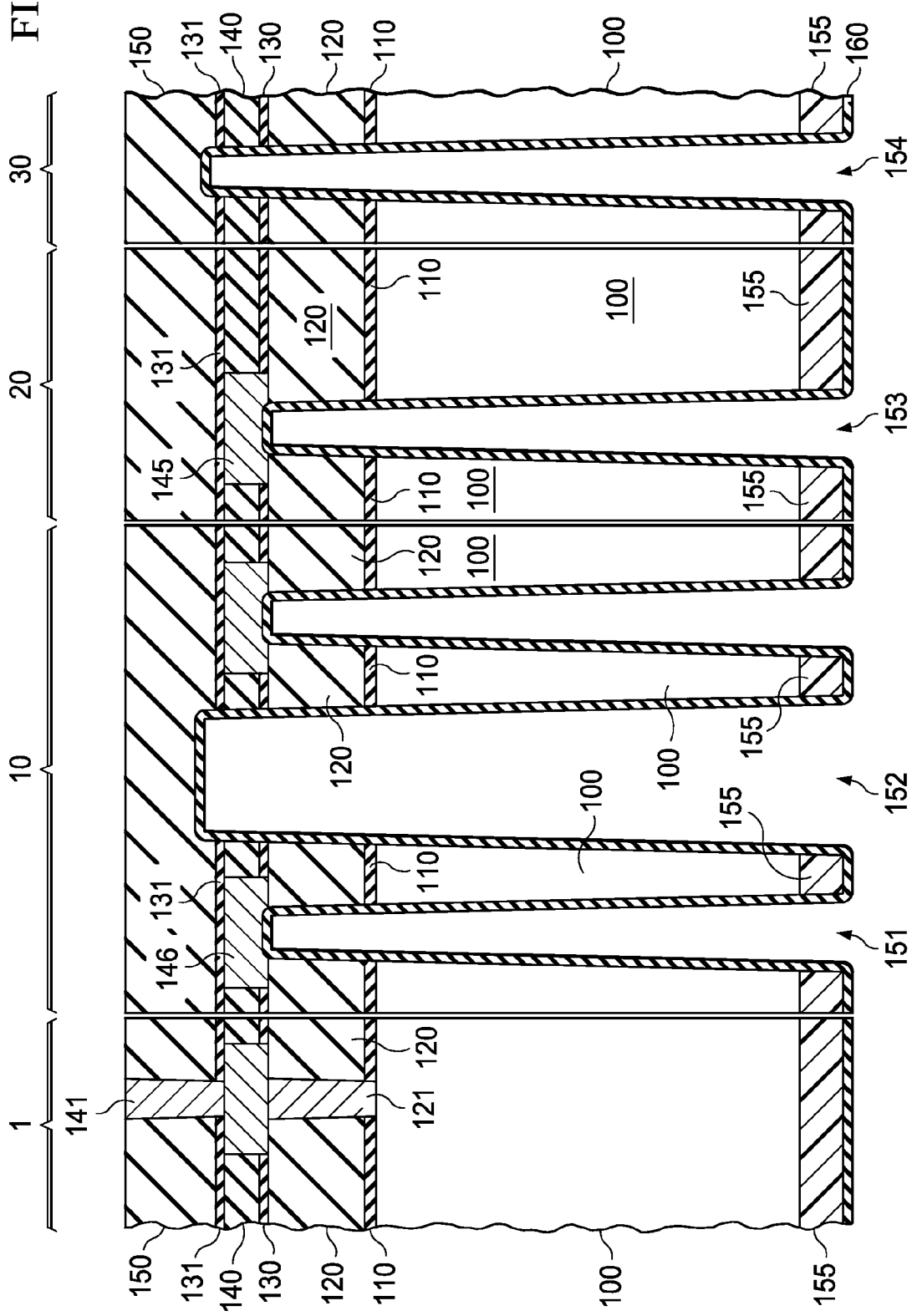

As illustrated next in FIG. 4e, a sidewall dielectric layer 160 is deposited over the sidewalls and bottom surface of the first, the second, the third, and the fourth through substrate openings 151-154. The sidewall dielectric layer 160 electrically isolates the conductive material in the through substrate via from active devices on the substrate 100. The sidewall dielectric layer 160 is deposited conformally over the exposed surfaces of the first, the second, the third, and the fourth through substrate openings 151-154. The sidewall dielectric layer 160 may be deposited by a suitable low temperature process such as plasma enhanced CVD and/or organic vapor phase deposition.

Figure 4F:
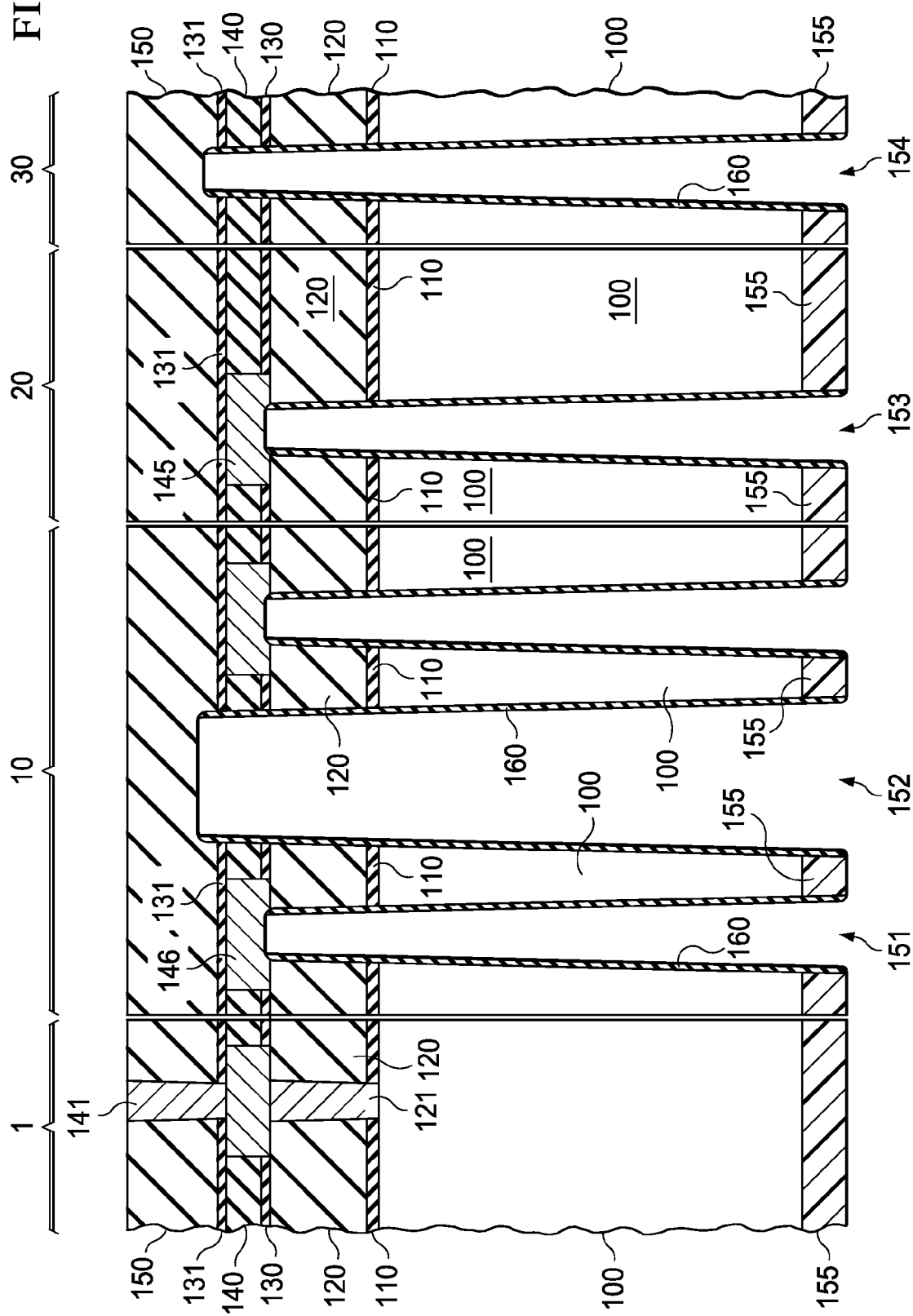

In some embodiments, the sidewall dielectric layer 160 is anisotropically etched forming sidewall spacers on the first, the second, the third, and the fourth through substrate openings 151-154 (FIG. 4f). In the embodiment described here, the sidewall dielectric layer 160 is removed from the bottom of the first, the second, the third, and the fourth through substrate openings 151-154. In some embodiments, the sidewall dielectric layer 160 is removed from the bottom of the first and the third through substrate openings 151 and 153 but not the second through substrate opening 152.

Referring next to FIG. 4g, a trench metal liner 170 is deposited over the sidewall dielectric layer 160 and a photo resist 180 is deposited and patterned. The trench metal liner 170 is conformal, and in one embodiment comprises a single layer of Ta, TaN, W, WN, WSi, TiN, and/or Ru as examples. In various embodiments, the trench metal liner 170 is used as a barrier layer for preventing metal from diffusing into the underlying substrate 100 and the sidewall dielectric layer 160. The trench metal liner 170 is deposited, for example, using sputtering processes. For high aspect ratio features, highly directional processes such as collimated sputtering techniques or CVD may be used.

In various embodiments, the trench metal liner 170 comprises multiple layers. In one embodiment, the trench metal liner 170 comprises a seed layer of copper over the diffusion barrier layer. This seed layer is deposited conformally over the barrier layer, using for example, a metal-organic CVD (MOCVD) process. For example, in one embodiment, a MOCVD process is used to deposit a TiN layer. In various embodiments, the trench metal liner 170 is deposited using a CVD process, or a collimated sputter deposition process. In one embodiment, the trench metal liner 170 comprising Ta or TaN is deposited using a collimated sputter deposition process. In another embodiment, the trench metal liner 170 comprising tungsten is deposited using a CVD process.

A dry film photoresist 180 is deposited after the trench metal liner 170 is deposited and patterned using photo lithography. The dry film photoresist 180 comprises a negative tone, aqueous developable dry resist, and is typically coated to a film thickness of 10-40 μm in single layer application. Examples of commercially available dry film photoresist 180 include Ordyl Alpha 900/Tokyo Ohka, MX5000/DuPont. Alternatively, a dummy layer may be filled into the first, the second, the third, and the fourth through substrate openings 151-154 before depositing the photo resist layer. The dummy layer can be removed during subsequent etching. Patterns are formed using photo lithography to open areas for filling the first and the third through substrate openings 151 and 153. The photo lithography patterns for features in both the contact region 20 and the spiral coil region 10 simultaneously. The photo lithography patterns for both the through substrate vias and redistribution lines in the contact region 20, and the through substrate coils (which may also include backside redistribution lines) in the spiral coil region 10.

Figure 4H:
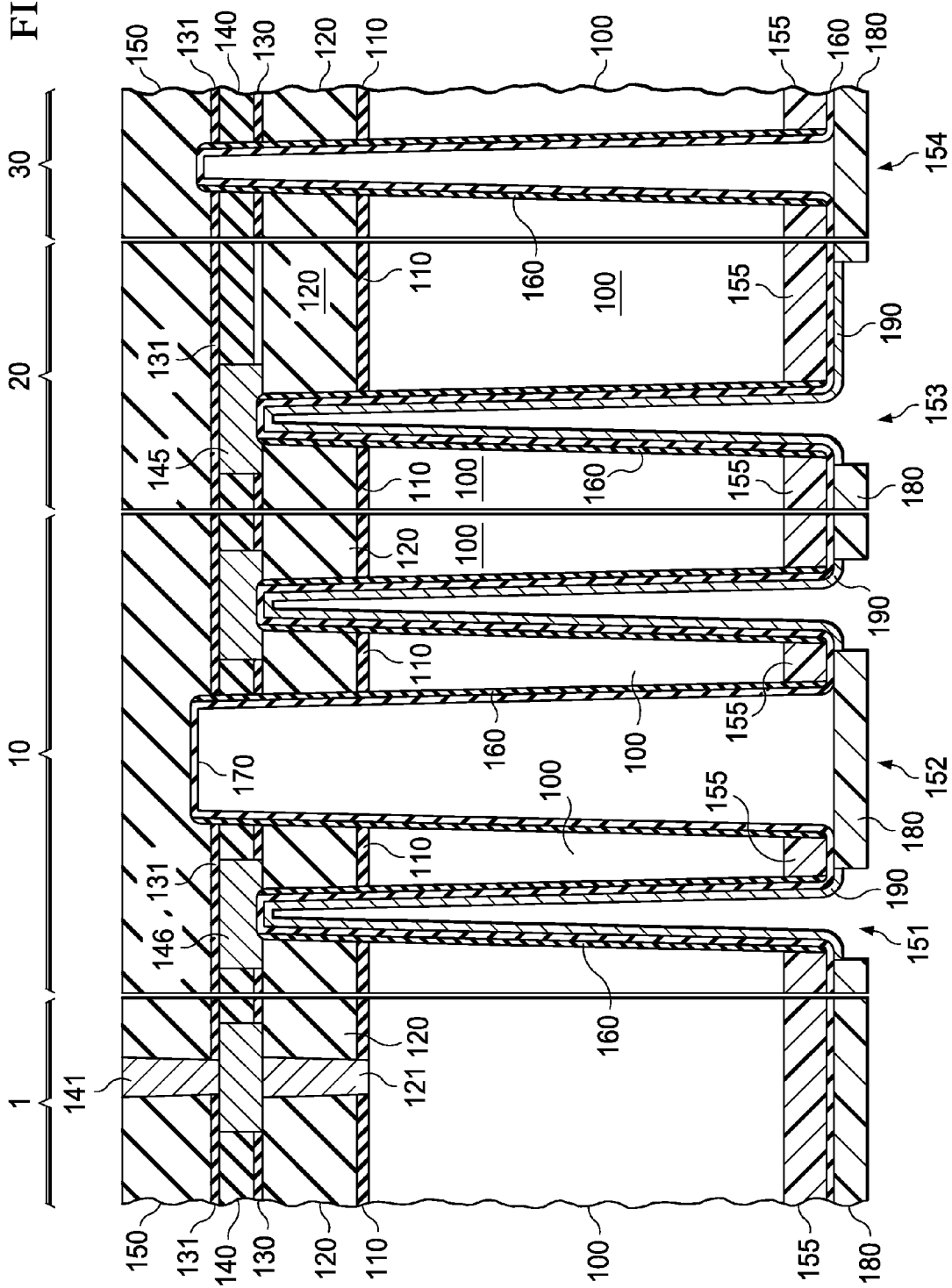

Referring to FIG. 4h, a conductive fill material 190 is then deposited using, for example, an electroplating process. In some embodiments, the conductive fill material 190 is partially filled leaving a gap while in other embodiments it is fully filled. In one embodiment, the conductive fill material 190 comprises copper. In other embodiments, the conductive fill material 190 comprises aluminum, tantalum, ruthenium, platinum, nickel, silver, gold, tungsten, tin, lead, or combinations thereof. If the conductive fill material 190 comprises tungsten, a bi-layer seed layer comprising CVD titanium nitride and silicon doped tungsten are used. Similarly, in some embodiments, the conductive fill material 190 comprises doped poly-silicon or silicides.

As next illustrated in FIG. 4i, the dry film photoresist 180 is stripped, exposing the trench metal liner 170 (FIGS. 4g and 4h) in the second through substrate opening 152. The exposed trench metal liner 170 is etched e.g., using a wet etch chemistry. Hence, all conductive material from the second through substrate opening 152 is now removed.

Figure 4J:
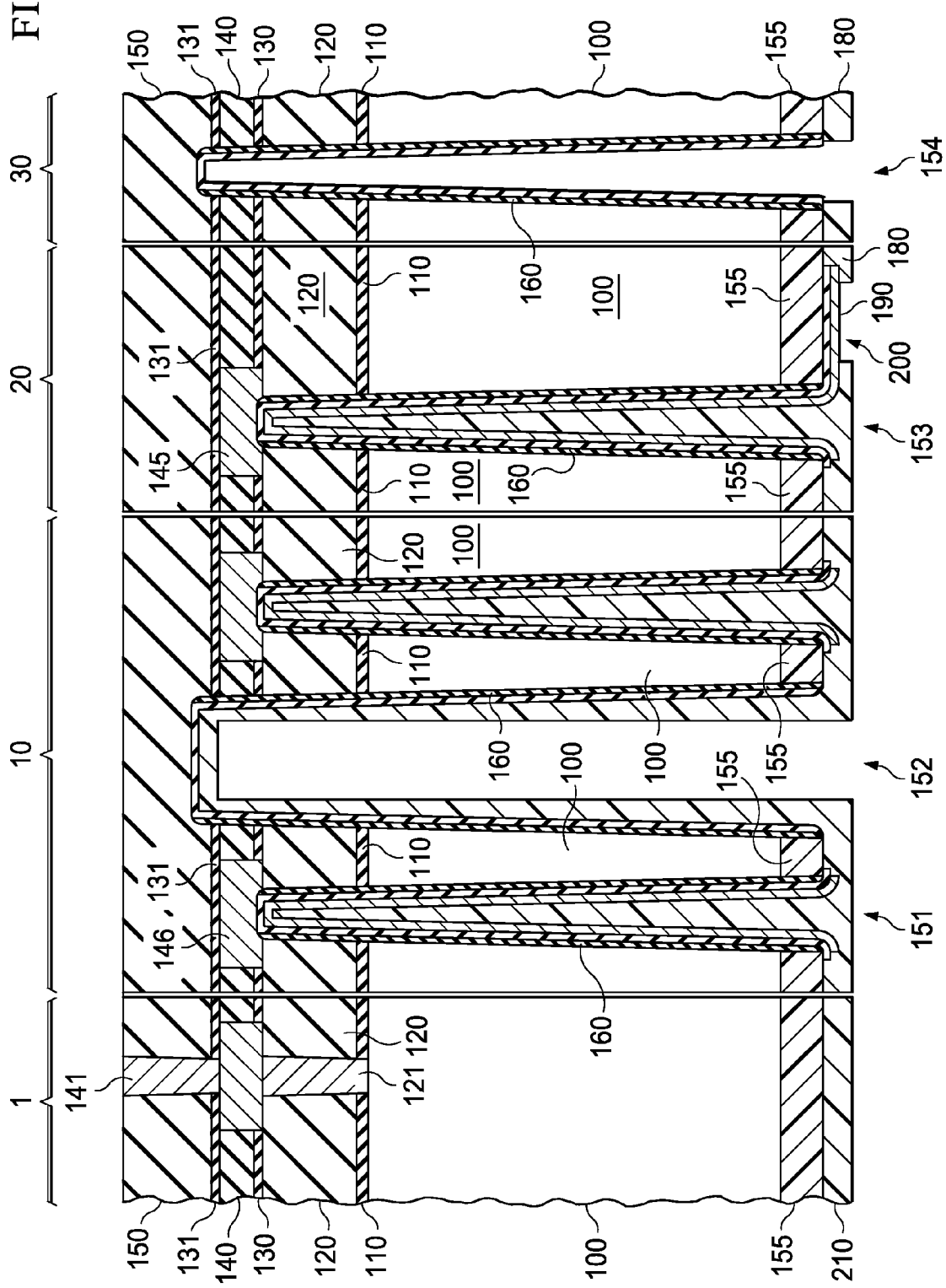

As illustrated in FIG. 4j, an imide layer 210 is deposited into the unfilled portions of the first and the third through substrate openings 151 and 153 to form a liner on the sidewalls and bottom surface of the second through substrate opening 152. The imide layer 210 is patterned to expose back side contacts such as backside pad 200.

Alternatively, in some embodiments, the second through substrate opening 152 is filled with a magnetic material as described with respect to FIG. 2b. In such embodiments, after patterning a photo resist that selectively exposes the second through substrate opening 152, the magnetic material is deposited into the second through substrate opening 152. The deposition is followed by the deposition of the imide layer 210.

Figure 4K:
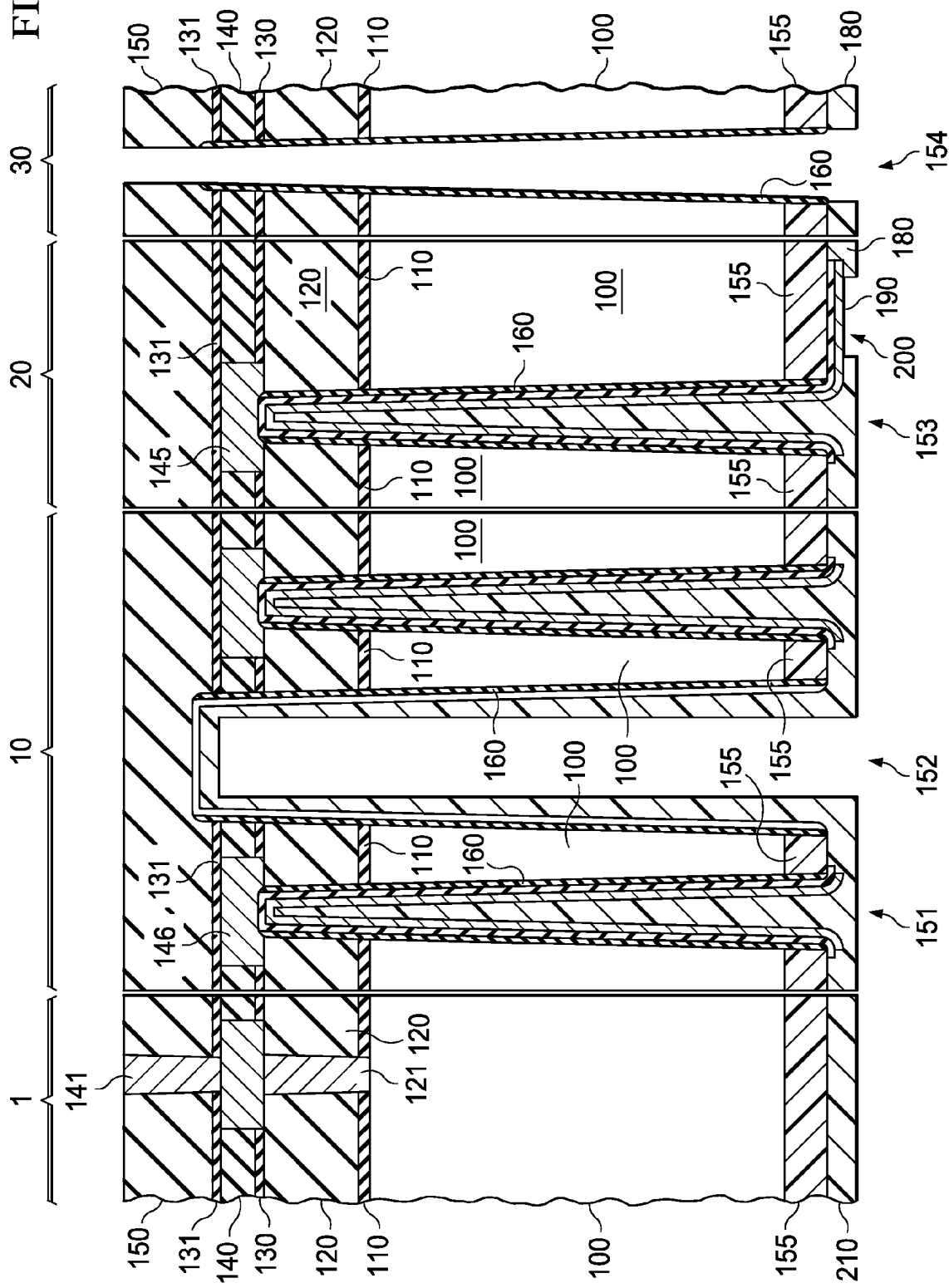

As shown in FIG. 4k, the wafer is subsequently diced by extending the fourth through substrate opening 154 in the kerf region 30 into the upper metallization layers using suitable mechanical and/or chemical processes.

Advantageously in various embodiments, the through substrate coils are formed along with the through substrate vias and share the same processes. Similarly, the through substrate opening for dicing the wafer is performed along with the through substrate via opening in the contact region 20. This advantageously reduces the fabrication cost while improving the electrical performance because of the improved design of the through substrate coil.

For many applications, the high process costs for the whole TSV module (etching, liner deposition and filling) do not compensate the gained benefit in chip area. Using embodiments of the invention lowers the process costs extending the field of application of TSVs significantly.

Currently, spiral inductors in the upper metallization layers are commonly used to fabricate integrated coils. This integration gives optimized quality factors due to its spacing from the substrate. But this is not sufficient for applications, where Ohmic losses in the coil are critical and higher inductances are required. Embodiments of the invention reduce resistance while increasing the inductance by using very deep trenches filled with metal, thus improving the quality factor. However, this gain in quality factor does not increase the cost of fabrication because it is shared with the cost of producing TSV contacts and/or savings in dicing. Similarly, the dicing costs are shared with the cost of forming TSV contacts.

In various embodiments, the present invention allows a cost efficient production because four features are fabricated in one process module using the same materials and unit process steps, the four features being a through substrate coil, a cavity in the core of the coil, a substrate contact, and the separation of the chips.

Advantageously, fabrication of coils in silicon allows use of silicon reactive ion etching processes where typically, deeper trenches with high aspect ratios can be achieved compared to etch processes in other materials. The electrical benefits of coils formed in silicon are higher inductivity of coil and lower Ohmic losses in the coil.

Embodiments of the invention reduce processing costs by using common or single unit processes for multiple structures, lower dicing costs by avoiding slow mechanical dicing, and cheaper chip packaging because pads on the wafer backside allow chip stacking and avoid expensive wire bonding.

Figure 5A:
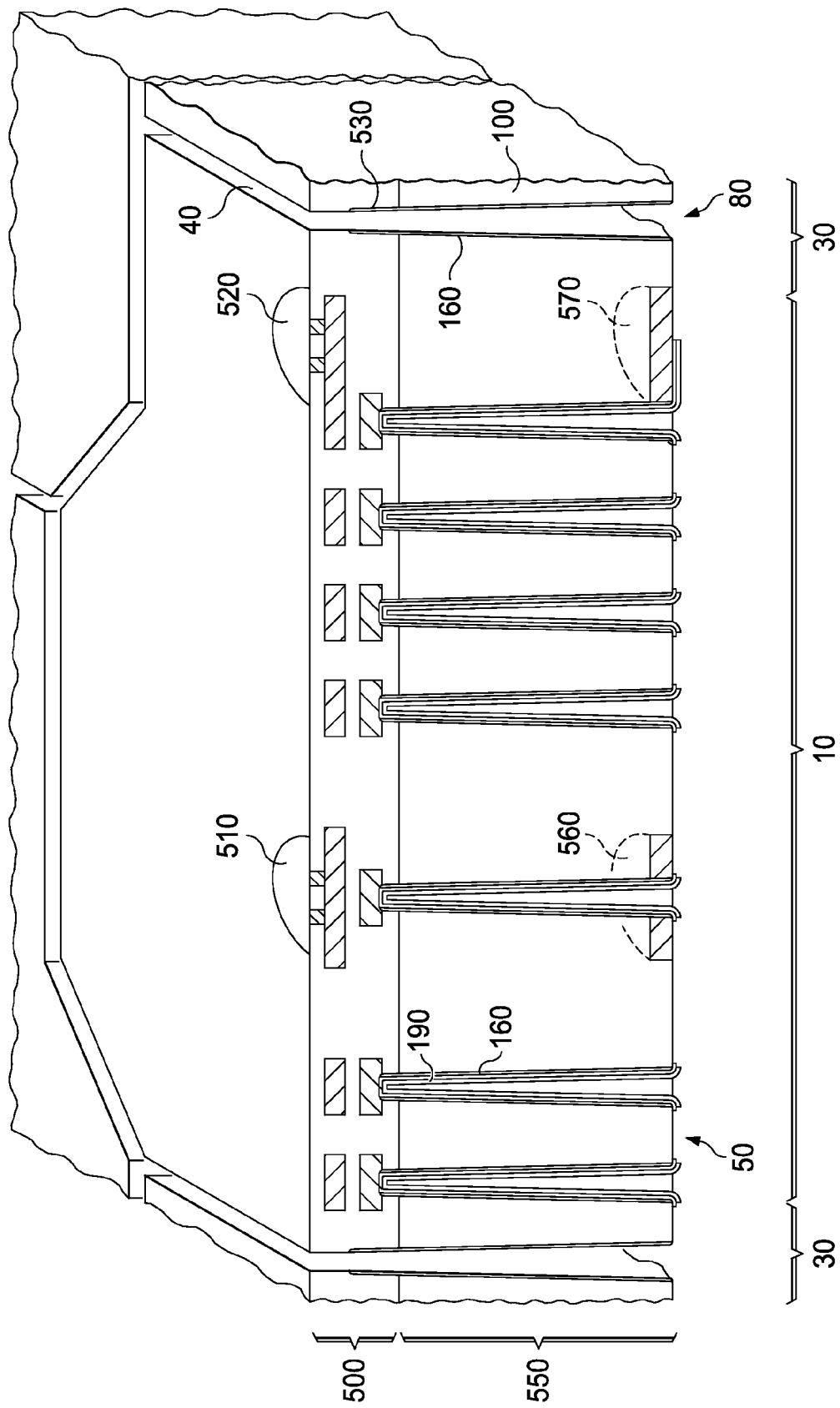
Figure 5B:
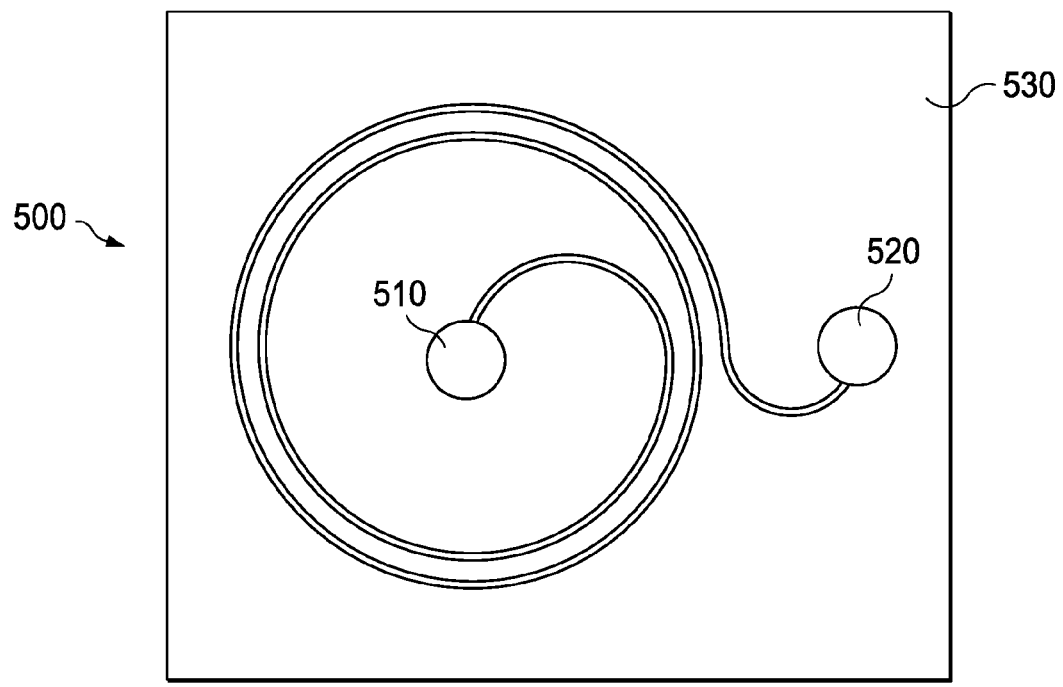
Figure 5C:
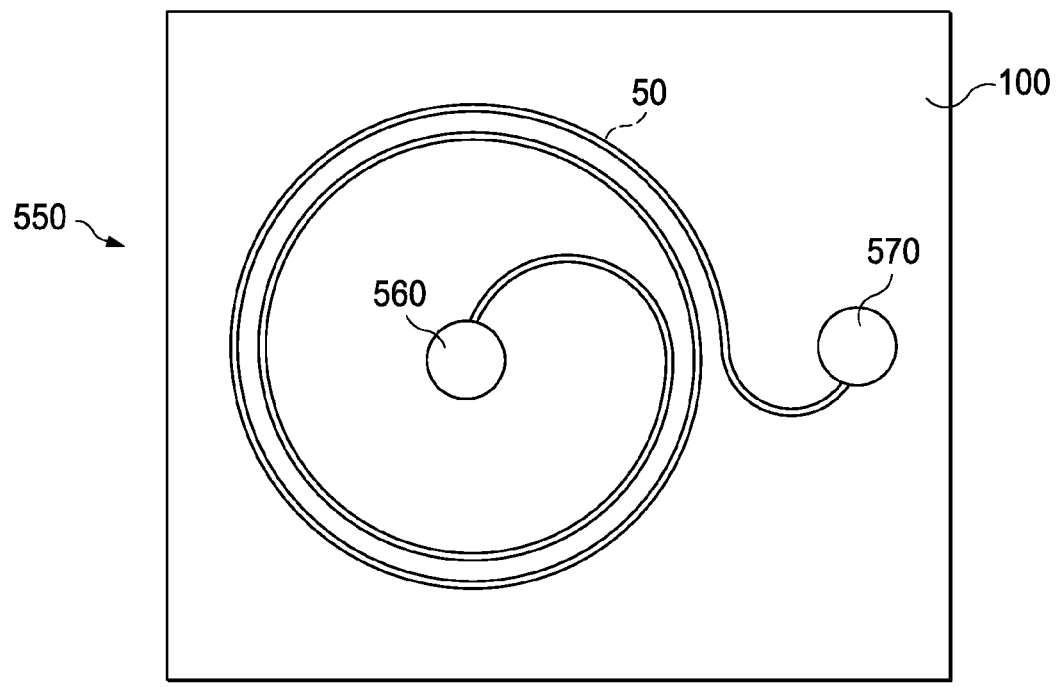

FIG. 5, which includes FIGS. 5a and 5c, illustrates a transformer coil in accordance with an embodiment of the invention. FIG. 5a illustrates a perspective view whereas FIGS. 5b and 5c illustrate top views of the transformer device.

Referring to FIG. 5a, the semiconductor device comprises a transformer comprising a first transformer coil 500 and a second transformer coil 550. In one embodiment, the first transformer coil 500 forms the transmitter coil, and the second transformer coil 550 forms the receiver coil.

The first transformer coil 500 is formed within the metallization layers and disposed within the dielectric layers 530. The second transformer coil 550 in various embodiments comprises a through substrate coil 50 formed within a substrate 100. The through substrate coil 50 is disposed within the substrate 100 and formed in a through substrate opening that is completely or partially filled with a conductive fill material 190 and lined with an insulating dielectric liner (e.g., sidewall dielectric layer 160).

The first and the second transformer coils 500 and 550 are inductively coupled. The thickness of the dielectric isolation between the first and the second transformer coils 500 and 550 may be changed to change the inductive coupling between the first and the second transformer coils 500 and 550. Similarly, the dielectric material between the first and the second transformer coils 500 and 550 may be changed to change the inductive coupling between them. Hence, the breakdown voltage can be easily achieved by simple changes in the process. Consequently, and advantageously unlike conventional transformer designs, deep via holes through the thick imide isolation is not necessary.

The first transformer coil 500 is coupled through first and second front side contact pads 510 and 520 (see also FIG. 5b). Although in FIG. 5a, the first and the second front side contact pads 510 and 520 are disposed on the top surface of the semiconductor device, in various embodiments, the first and second front side contact pads 510 and 520 may be formed within lower level metallization levels. The through substrate coil 50 (and hence the second transformer coil 550) is coupled to first and second back side contact pads 560 and 570 (FIGS. 5a and 5c). The first and second back side contact pads 560 and 570 may be formed within a backside redistribution line layer in some embodiments.

As the contacts of the first transformer coil 500 are disposed on the top side while the contacts of the second transformer coil 550 are disposed on the bottom side, the described embodiment enables easy assembly of the receiver and transmitter ICs via chip stacking. Hence, in various embodiments, the transformers can be built using 3D integration as System in Package units.

In various embodiments, the semiconductor device may also comprise a through substrate opening 80 forming a kerf 40. Similarly, the semiconductor device may comprise other components including through substrate vias, and other active circuitry.

Referring to FIG. 5c, the through substrate coil 50 comprises a spiral coil. Sharp corners are avoided in the layout of both the first and the second transformer coils 500 and 550 in order to withstand high voltages. In various embodiments, the through substrate coil 50 forming the second transformer coil 550 may comprise many turns or windings. While not shown in FIG. 5c, some parts of the through substrate coil 50 may be coupled through a redistribution line layer or a suitable interconnect.

As illustrated in FIG. 5c, the second transformer coil 550 does not have a core region. In various embodiments, the through substrate coil 50 may be formed as a discrete device or in a single integrated chip comprising other circuitry. In various embodiments, other suitable shapes of the through substrate coils may be used for forming the transformer.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, the method comprising:
   forming a first through substrate opening within a semiconductor substrate, the first through substrate opening extending from a bottom surface of the semiconductor substrate to an opposite top surface of the semiconductor substrate, wherein, in a plane parallel to the bottom surface, the first through substrate opening includes a ring shaped through substrate trench opening extending around a central region, wherein the ring shaped through substrate trench opening extends from the bottom surface of the semiconductor substrate to the top surface of the semiconductor substrate;
   lining sidewalls of the first through substrate opening with an insulating material; and
   forming a coil for an inductor by filling the first through substrate opening at least partially with a conductive material, wherein the inductor comprises the central region surrounded by the coil and the first through substrate opening filled with the conductive material.

2. The method of claim 1, further comprising forming a second through substrate opening in the central region, wherein the first through substrate opening is formed around the central region.

3. The method of claim 2, further comprising filling the second through substrate opening with a magnetic material.

4. The method of claim 1, wherein the first through substrate opening comprises an opening for a spiral coil, and wherein the ring shaped through substrate trench opening comprises a spiral design.

5. The method of claim 1, wherein the first through substrate opening comprises another ring shaped through substrate trench opening extending around the central region and the ring shaped through substrate trench opening, and wherein the ring shaped through substrate trench opening and the another ring shaped through substrate trench opening form a part of an opening for a concentric coil.

6. A method for forming a semiconductor device comprising:
   forming a first and a second through substrate opening in a semiconductor substrate, the second through substrate opening being formed around a first semiconductor die region of the semiconductor substrate, wherein the first through substrate opening and the second through substrate opening extend from a bottom surface of the semiconductor substrate to an opposite top surface of the semiconductor substrate, wherein the first through substrate opening comprises a ring shaped through substrate trench extending from the bottom surface to the top surface;
   lining surfaces exposed by the first and the second through substrate openings with an insulating material;
   forming a through substrate via by filling the first through substrate opening at least partially with a conductive material; and
   extending the second through substrate opening through a metallization layer disposed over the top surface of the semiconductor substrate to separate the first semiconductor die region from a remaining portion of the semiconductor substrate.

7. The method of claim 6, further comprising:
   forming a third through substrate opening and a fourth through substrate opening, wherein the third and the fourth through substrate openings are formed simultaneously with the first and the second through substrate openings;
   lining the third and fourth through substrate openings with the insulating material; and
   filling the third through substrate opening at least partially with a conductive material.

8. The method of claim 7, wherein the third through substrate opening is formed around a central region, and wherein the fourth through substrate opening is disposed in the central region.

9. The method of claim 7, wherein the filling the third through substrate opening forms a coil for an inductor.

10. The method of claim 7, further comprising filling the fourth through substrate opening with a magnetic material.

11. The method of claim 6, wherein the first through substrate opening and the second through substrate have substantially the same width along the bottom surface.

12. A method for forming a semiconductor device comprising:
simultaneously forming a first and a second through substrate opening in a semiconductor substrate, the second through substrate opening being formed around a first semiconductor die region of the semiconductor substrate, wherein the first through substrate opening and the second through substrate opening extend from a bottom surface of the semiconductor substrate to an opposite top surface of the semiconductor substrate;
simultaneously lining surfaces exposed by the first and the second through substrate openings with an insulating material;
forming a through substrate via by filling the first through substrate opening at least partially with a conductive material;
extending the second through substrate opening through a metallization layer disposed over the top surface of the semiconductor substrate to separate the first semiconductor die region from a remaining portion of the semiconductor substrate; and
forming spacers on sidewalls of the first and the second through substrate openings by etching the insulating material from the bottom surfaces of the first and the second through substrate openings before filling the first through substrate opening.

13. A method for forming a semiconductor device comprising:
simultaneously forming a first and a second through substrate opening in a semiconductor substrate, the second through substrate opening being formed around a first semiconductor die region of the semiconductor substrate, wherein the first through substrate opening and the second through substrate opening extend from a bottom surface of the semiconductor substrate to an opposite top surface of the semiconductor substrate;
simultaneously lining surfaces exposed by the first and the second through substrate openings with an insulating material;
forming a through substrate via by filling the first through substrate opening at least partially with a conductive material; and
extending the second through substrate opening through a metallization layer disposed over the top surface of the semiconductor substrate to separate the first semiconductor die region from a remaining portion of the semiconductor substrate, wherein simultaneously forming the first and the second through substrate opening comprises etching the semiconductor substrate from the bottom surface in a common etching step, the bottom surface being opposite to the top surface having active devices.

14. A method for forming a semiconductor device comprising:
simultaneously forming a first, a second, and a third through substrate openings within a semiconductor substrate, the first through substrate opening being disposed at least partially around the second through substrate opening, the first, the second, and the third through substrate openings extending from a bottom surface of a semiconductor substrate to an opposite top surface of the semiconductor substrate;
forming a first liner within the first through substrate opening, a second liner within the second through substrate opening, and a third liner within the third through substrate opening by simultaneously lining the first, the second, and the third through substrate openings with an insulating material; and
simultaneously filling the first and the third through substrate openings at least partially with a conductive material thereby forming an inductor and a through substrate via.

15. The method of claim 14, further comprising filling the second through substrate opening with a magnetic material.

16. The method of claim 14, wherein the conductive material comprises a non-magnetic metallic material.

17. The method of claim 14, further comprising:
forming a fourth through substrate opening in the semiconductor substrate simultaneously with the first, the second, and the third through substrate openings, the fourth through substrate opening being formed around a first semiconductor die region comprising the first, the second, and the third through substrate openings, the fourth through substrate opening extending from the bottom surface of the semiconductor substrate to the top surface of the semiconductor substrate;
lining the fourth through substrate opening with an insulating material; and
extending the fourth through substrate opening through a metallization layer disposed over the top surface of the semiconductor substrate to separate the first semiconductor die region from a remaining portion of the semiconductor substrate.

18. The method of claim 14, further comprising forming spacers on the first, the second, and the third through substrate openings by etching the insulating material before filling the first and the third through substrate openings.

19. The method of claim 14, wherein the first through substrate opening and the third through substrate have substantially the same width along the bottom surface, and wherein the first through substrate opening is narrower than the second through substrate.

20. A method for forming a semiconductor device, the method comprising:
forming a first through substrate opening within a semiconductor substrate, the first through substrate opening extending from a bottom surface of the semiconductor substrate to an opposite top surface of the semiconductor substrate;
lining sidewalls of the first through substrate opening with an insulating material;
forming a coil for an inductor by filling the first through substrate opening at least partially with a conductive material, wherein the inductor comprises a central region surrounded by the coil; and
forming a second coil in a metallization layer above the top surface of the semiconductor substrate, the second coil being inductive coupled to the coil.

21. A method for forming a semiconductor device comprising:
forming a metallization layer over a top surface of a semiconductor substrate having the top surface and an opposite bottom surface;

forming a first landing pad in a first region and a second landing pad in a second region of the metallization layer;

using an etching process from the bottom surface of the semiconductor substrate, simultaneously forming a first, a second, and a third through substrate openings within the semiconductor substrate, the first through substrate opening being disposed at least partially around the second through substrate opening, the first, the second, and the third through substrate openings extending from the bottom surface to the top surface of the semiconductor substrate, the etching of the first and the third through substrate openings being stopped at the first and the second landing pads;

forming a first liner within the first through substrate opening, a second liner within the second through substrate opening, and a third liner within the third through substrate opening by simultaneously lining the first, the second, and the third through substrate openings with an insulating material; and forming a through substrate via and an inductor coil surrounding a central region comprising the second through substrate opening, wherein the forming the through substrate via and the inductor coil comprises depositing a conductive material simultaneously into the first and the third through substrate openings without depositing the conductive material into the second through substrate opening after simultaneously lining the first, the second, and the third through substrate openings.

22. The method of claim 21, wherein the first through substrate opening and the third through substrate have substantially the same width along the bottom surface, and wherein the first through substrate opening is narrower than the second through substrate.

23. The method of claim 21, further comprising filling the second through substrate opening with a magnetic material different from the conductive material.

24. The method of claim 21, further comprising:

forming a fourth through substrate opening in the semiconductor substrate simultaneously with the first, the second, and the third through substrate openings, the fourth through substrate opening being formed around a first semiconductor die region comprising the first, the second, and the third through substrate openings, the fourth through substrate opening extending from the bottom surface of the semiconductor substrate to the top surface of the semiconductor substrate;

forming a fourth liner within the fourth through substrate opening by lining the fourth through substrate opening with the insulating material while forming the first, the second, and the third liners; and after forming the through substrate via and the inductor coil, extending the fourth through substrate opening through a metallization layer disposed over the top surface of the semiconductor substrate to singulate the first semiconductor die region from a remaining portion of the semiconductor substrate.

25. The method of claim 21, further comprising forming a second inductor coil in a metallization layer above the top surface of the semiconductor substrate, the second coil being inductive coupled to the inductor coil.

* * * * *